(12) United States Patent
Gold et al.

(10) Patent No.: US 6,560,140 B2
(45) Date of Patent: *May 6, 2003

(54) SINGLE ENDED TWO-STAGE MEMORY CELL

(75) Inventors: Spencer M. Gold, Pepperell, MA (US); Julie Staraitis, Ayer, MA (US)

(73) Assignee: Sun Microsystems, Inc., Santa Clara, CA (US)

( * ) Notice: Subject to any disclaimer, the term of this patent is extended or adjusted under 35 U.S.C. 154(b) by 9 days.

This patent is subject to a terminal disclaimer.

(21) Appl. No.: 09/852,427

(22) Filed: May 9, 2001

(65) Prior Publication Data

US 2002/0167846 A1 Nov. 14, 2002

(51) Int. Cl.[7] .................................................. G11C 7/00
(52) U.S. Cl. ........................................................ 365/154
(58) Field of Search ................................... 365/154, 49

(56) References Cited

U.S. PATENT DOCUMENTS 4,651,303 A  *  3/1987  Dias et al. .................. 365/185
6,118,690 A  *  9/2000  Jiang et al. ................. 365/156
6,353,552 B2 *  3/2002  Sample et al. .............. 365/154

OTHER PUBLICATIONS

U.S. patent application Ser. No. 09/852,429, Staraitis et al., filed May 9, 2001.

* cited by examiner

*Primary Examiner*—Vu A. Le
(74) *Attorney, Agent, or Firm*—Lahive & Cockfield, LLP

(57) ABSTRACT

The present invention provides a memory array having an array structure that has at least one memory cell, including a word write bit line and a single transfer line. The memory array is also provided with a two-stage memory cell having a speculative storage node, a non-speculative storage node, and a circuit. The two-stage memory cell is electrically coupled to the array structure. Activation of the circuit causes a speculative data value stored in the speculative storage node to be written to the non-speculative storage node.

28 Claims, 3 Drawing Sheets

SINGLE ENDED TWO-STAGE MEMORY CELL

TECHNICAL FIELD

The invention relates to memory devices, specifically memory devices using a memory cell for storing data.

BACKGROUND OF THE INVENTION

A memory cell is a unit of a memory structure capable of holding at least one bit of data. A memory cell may be formed by a wide variety of methods, such as, for example, a breadboard circuit wiring using off-the-shelf electronic components or semiconductor fabrication.

Memory cells are widely used in computers and other electronic processing devices for temporary storage of data. Oftentimes, memory cells are used to repeatedly store different data values as the computer or other processing device is calculating various alternatives or seeking to obtain a solution by reviewing all possibilities. FIG. 1 shows a flowchart of the steps performed during the transition from speculative data to permanent data. Initially, in step 101, the microprocessor executes instructions speculatively. Speculative data is produced in step 102. Data values determined in the course of such activities are commonly called "speculative" until the data value is determined to be the desired, final or correct result of the process. In step 103, the final data value becomes a "permanent" or non-speculative data value. Throughout any specific series of calculations, there may be multiple segments of analysis, each ending with a permanent data value. Permanent data values are not typically stored indefinitely, and are eventually overwritten or flushed. Thus, it is determined whether the speculative data stored as permanent data is new data as shown in (step 104). If it is determined that permanent data is new, then prior permanent data is flush as shown in (step 105). Otherwise, the permanent is not flushed as shown in (step 106). However, permanent data values are often retained much longer than any one of the typical series of speculative data values generated during a calculation.

Storing of a permanent data value while proceeding to generate further speculative data values is typically problematic for a conventional memory cell, in which only the last data value stored within the cell can be read. A conventional memory cell can retain only one data value and therefore is unable to retain a permanent data value while simultaneously storing a new speculative data value. Therefore, conventional applications involving storage of speculative data involve an additional memory array, or multiple memory cells within a single array, to store data desired to be retained.

The use of memory cells in the handling of multiple values of speculative data has typically involved extensive processor time, because a processor is either required to read data from a separate memory array and then write the data to another memory array or manage multiple memory cells for a single desired data value. Specifically, when a determination is made that the presently stored speculative data value 104 is no longer speculative and is desired, or permanent, data, the processor is called upon to perform multiple memory-management tasks.

SUMMARY OF THE INVENTION

According to one embodiment of the invention, a memory cell is provided having a speculative storage node adapted to store a speculative data value, a non-speculative storage node adapted to store a permanent data value and a circuit, electrically coupled to the non-speculative storage node and the speculative storage node. When the circuit is activated, the speculative data value is written to the non-speculative storage node and stored as the permanent data value.

According to another embodiment of the invention, a memory cell is provided having an array structure. The memory array is also provided with a two-stage memory cell having a speculative storage node, a non-speculative storage node, and a circuit. The two-stage memory cell is electrically coupled to the array structure. Activation of the circuit causes a speculative data value stored in the speculative storage node to be written to the non-speculative storage node.

According to another embodiment of the invention, a memory array is provided having an array structure that has at least one memory cell, including a word write bit line and a single transfer line. The memory array is also provided with a two-stage memory cell having a speculative storage node, a non-speculative storage node, and a circuit. The two-stage memory cell is electrically coupled to the array structure. Activation of the circuit causes a speculative data value stored in the speculative storage node to be written to the non-speculative storage node.

BRIEF DESCRIPTION OF THE DRAWINGS

These and other features and advantages of the present invention will be fully understood by reference to the following detailed description in conjunction with the attached drawings.

DETAILED DESCRIPTION

Memory cells will commonly be used to repeatedly store different data values, for example, a computer or other processing device may calculate various alternatives or seek to obtain a solution by reviewing all possibilities, and the computer stores the alternatives or possibilities in memory cells. Data values determined in the course of such activities are commonly called "speculative" until the data values are determined to be the desired, final or correct results of the process. As used herein, each final data value is called a "permanent" data value.

Throughout any specific series of calculations, there may be multiple segments of analysis, each ending with a permanent data value. Permanent data values are not typically stored indefinitely and are eventually overwritten. However, permanent data values are often retained much longer than any one of the typical series of speculative data values generated during a calculation.

The illustrative embodiment of the present invention recognizes a need for simplified operation of a memory cell in the handling of speculative data. The illustrative embodiment offers a two-stage memory cell with the ability to store the desired data value while simultaneously storing the latest iteration of speculative data. Upon the determination that the latest speculative data is the desired data, the speculative data can be quickly and easily stored as desired data, and the ability to store the latest iteration of speculative data resumes.

The present invention is applicable to all memory cell applications, including RAM, EPROM and other varieties of storage devices.

Figure 1:
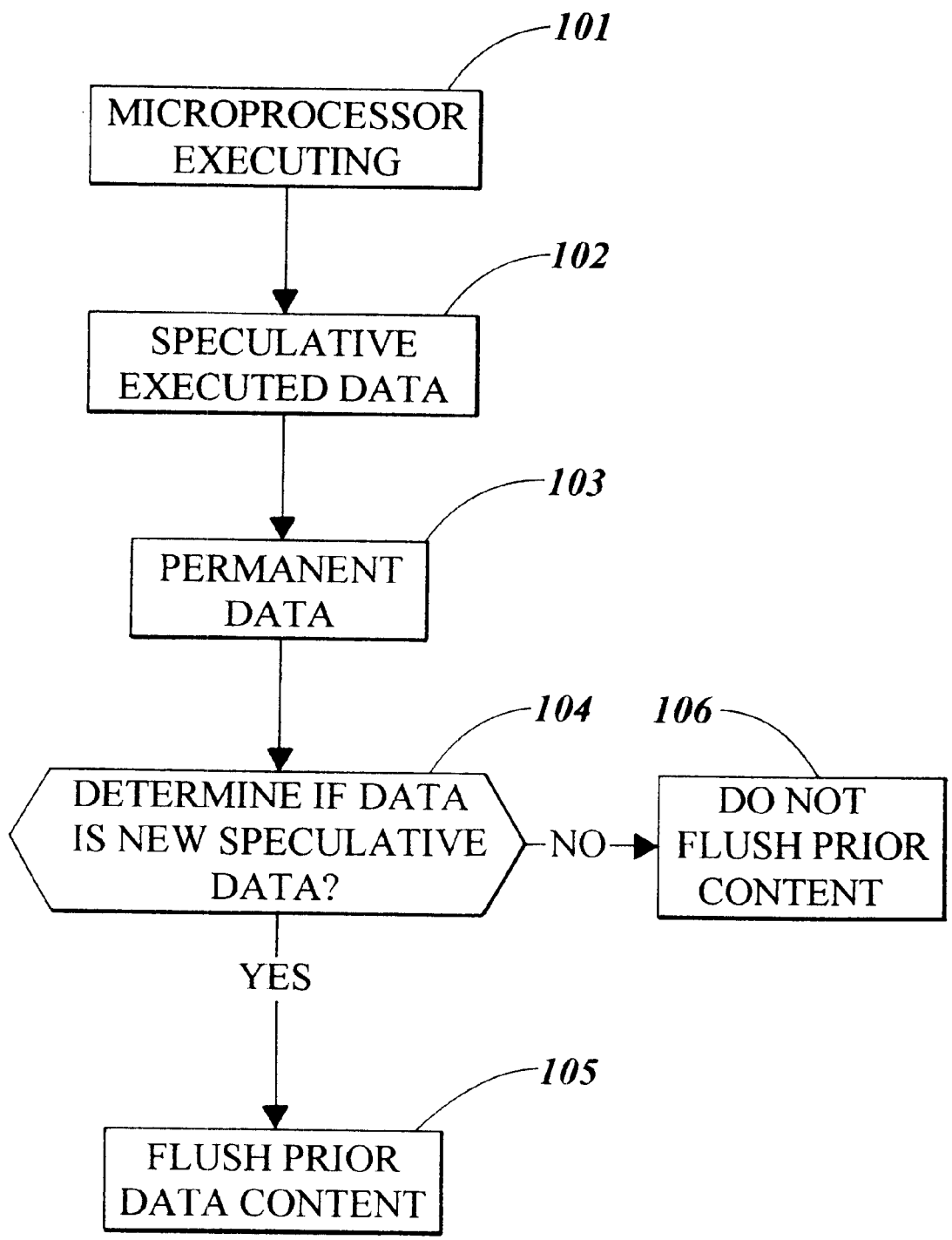
FIG. 1 is a diagram illustrating how speculative data is overwritten or flushed in a memory cell.
Figure 2:
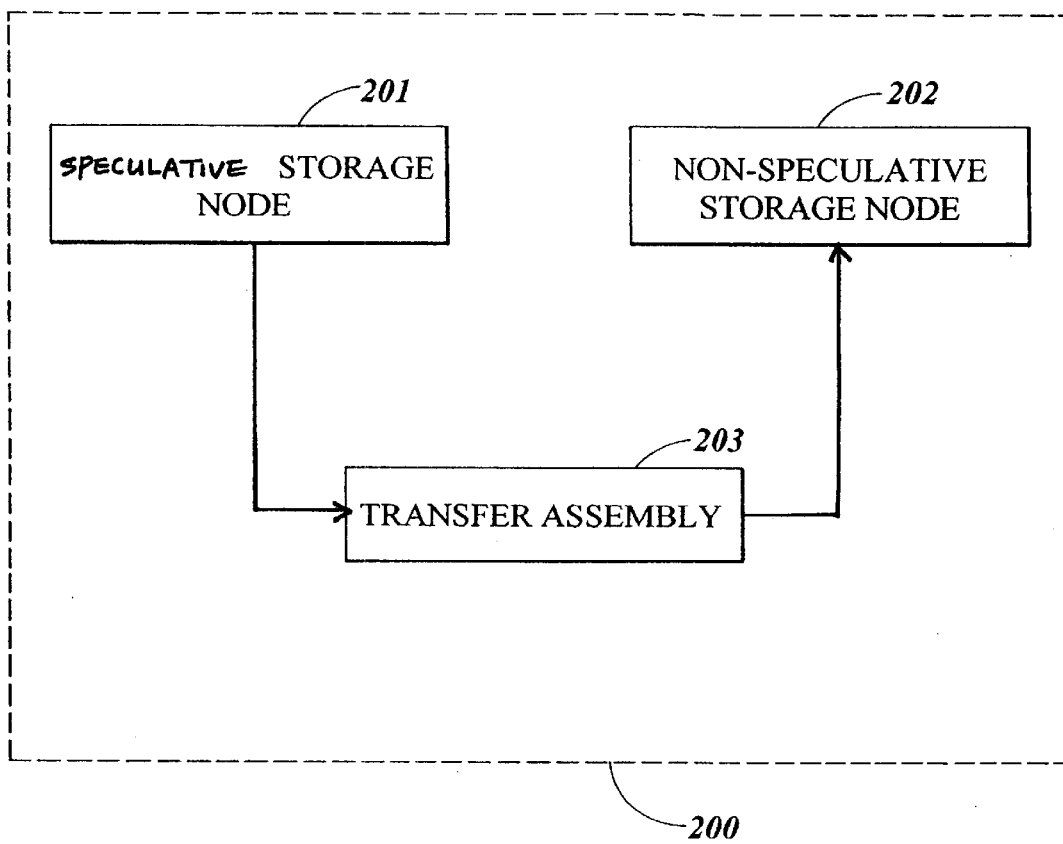
FIG. 2 is a diagram of major components found in the preferred embodiment of the present invention.

According to the illustrative embodiment of the invention, a two-stage memory cell 200 is provided, as shown in FIG. 2. The two-stage memory cell 200 allows successive iterations of speculative data to be written to a speculative storage node 201. Then, upon an indication that the speculative data should be permanently stored, a circuit writes the value of the speculative data to a non-speculative storage node 202 within the memory cell 200. The circuit is preferably deactivated to allow further speculative data to be written only to the speculative storage node 201. The value of the non-speculative storage node 202 is then "permanent data".

The non-speculative storage node 202 stores the permanent data, while the speculative storage node 201 can again be written to successively until another indication that the speculative data stored by the speculative storage node should be written to the non-speculative storage node 202. Both the speculative storage node 201 and non-speculative storage node 202 typically overwrite any previously stored value upon the writing of another value.

The invention is not limited to multiple writings of speculative data to speculative storage node 201, and the invention includes only a single writing of speculative data to the speculative storage node 201.

In a preferred variation of this embodiment of the invention, the two-stage memory cell 200 is structured to prevent direct writing to non-speculative storage node 202 except by the use of a circuit 501 in transferring the speculative data value stored in the speculative storage node 201.

Figure 3:
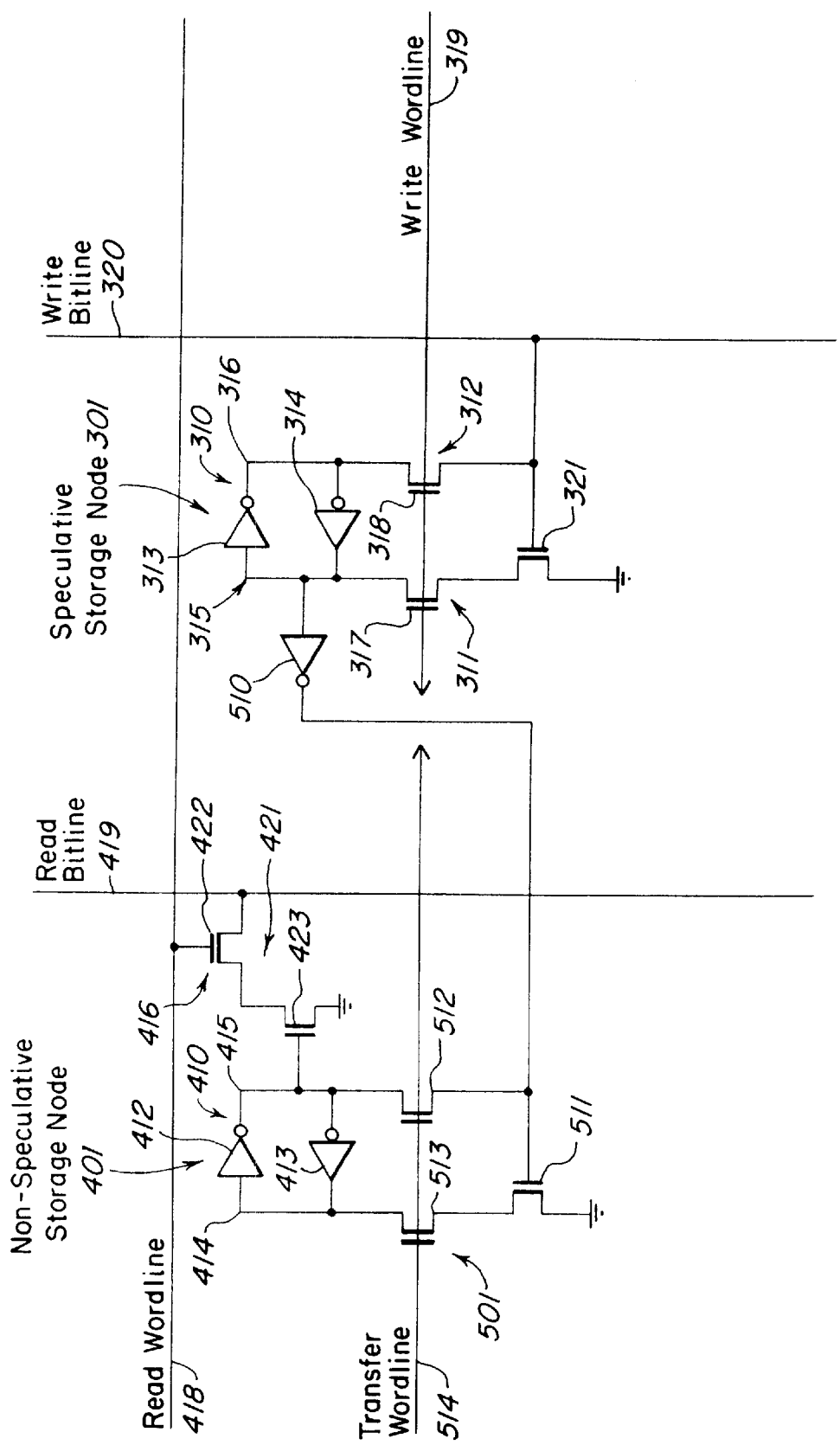
FIG. 3 is a more detailed circuit diagram of components of the illustrative embodiment of the present invention illustrating how speculative data is transferred to a non-speculative storage node.

FIG. 3 shows the circuitry employed in the illustrative embodiment to provide the two-stage memory cell. A two-stage memory cell 300 is provided with a speculative storage node 301 and a non-speculative storage node 401. A circuit is provided to selectively electrically couple the speculative storage node and a non-speculative storage node.

The speculative storage node 301 includes a speculative storage element 310, a first write assembly 311 and a second write assembly 312. The speculative storage element 310 is preferably formed by a first speculative inverter 313 cross-coupled with a second speculative inverter 314. The speculative storage element 310 may alternatively be constructed using a variety of other components capable of storing a data value known to one of skill in the art. Examples of alternative components include, but are not limited to, capacitors, NAND gates and/or NOR gates. Further variations of the speculative storage element 310 include additional inverters or combination of any of the above.

The speculative storage element 310 preferably stores a data value by maintaining an output voltage representative of the stored data value. By way of example, the present embodiment preferably uses voltage of approximately 0 volts and 1 volts for low and high data values respectively.

The speculative storage element 310 includes a first side 315 and a second side 316. The first write assembly 311 is electrically coupled to the first side 315 of speculative storage element 310. Similarly, the second write assembly 312 is electrically coupled to the second side 316 of the speculative storage element 310.

As shown in FIG. 3, the cell 300 implements single-ended read bit line, write bit line, read word line, and write word line, which requires fewer lines and therefore requires less area to implement.

The first write assembly 311 includes a first MOS transistor 317 configured to selectively supply a voltage to the first side of speculative element 310 upon activation of an external write circuitry. Similarly, the second write assembly 312 includes a second MOS transistor 318 configured so as to selectively provide a write voltage to the second side 316 of speculative storage element 310.

When used in a memory array, the two-stage memory cell 300 is electrically coupled to write word line 319 and a write bit line 320 configured in an array structure, capable of individually accessing each two-stage memory cell 300 in the array. As shown in FIG. 3, the speculative storage node 301 is electrically coupled to a write word line 319. The write word line 319 is electrically coupled to gates of both the first MOS transistor 317 and the second MOS transistor 318. Therefore, upon activation of the write word line 319, both the first MOS transistor 317 and second MOS transistor 318 are closed, e.g., activated. The speculative storage node 301 is coupled to a write bit line 320. The write bit line 320 is coupled to a gate of a third MOS transistor 321.

In operation, the speculative data value is written to the speculative storage node 301 by first activating write word line 319, thereby activating first MOS transistor 317 and second MOS transistor 318. While write word line 319 is active, the write bit line 320 is activated. In the present embodiment, driving the write data bit line 320 low and asserting the write word line 319 high writes a "1" into the speculative memory node 310. Driving the write data bit line 320 high and asserting the write word line 319 writes a "0" into the speculative storage 310. A "1" value implies a high voltage on node 315 and a low voltage on node 316, while a "0" value implies a low voltage on the node 315 and a high voltage on node 316.

For example, if the write bit line 320 is activated while the write word line 319 is active, a high speculative value is written into the speculative storage node 301. The first MOS transistor 317 and second MOS 318 transistor are both active. The grounding MOS transistor 321 is also active. The grounding MOS transistor 321 grounds out the voltage values in the inverters 313 and 314. Essentially, the voltage on the first side 315 of the speculative storage element 310 is set to a low voltage value, and the second side 316 of the speculative storage element is set to a high voltage. The input into inverter 510 is low and thus turned high at the output. The voltages continue to alternate between the first and second speculative inverter 313 and 314 as discussed above. Even after the deactivation of write word line 319 and write bit line 320.

If the write bit line 320 is not activated and the write word line 319 is high, a low speculative value is written into the speculative storage node 301. The first MOS transistor 317 and second MOS 318 transistor are both active. The ground MOS transistor 321 is not activated. Thus, a high voltage value is created in the first side 315 of the speculative storage element 310 and low voltage value in the second side 316 of the speculative storage node element 310. The input into inverter 510 is high and thus turned low at the output.

The two-stage memory cell 300 is also provided with a non-speculative storage node 401, as shown in FIG. 3. The non-speculative storage node 401 includes a non-speculative storage element 410, which includes a first non-speculative inverter 412 and a second non-speculative inverter 413. A variety of alternative configurations are within the scope of the invention, as discussed above in relation to the speculative storage element 310. Similar to the speculative storage element 310, the non-speculative storage element 410 includes a first side 414 and a second side 415.

A first read assembly 421 includes a fourth MOS transistor 422 and a fifth MOS transistor 423 electrically coupled in series so as to provide, upon activation of both, path to ground from a read bit line 419. The gate of the fourth transistor 422 is electrically coupled to a read word line 418 and a gate of the fifth MOS transistor 423 is electrically coupled to the second side 415 of non-speculative storage element 410. The source of fifth MOS transistor 423 is grounded.

A circuit assembly 501 is also provided in the two-stage memory cell 300. The circuit assembly 501 includes a transfer inverter 510 electrically coupled to the first side 315 of speculative storage element 310. The transfer inverter 510 is also electrically coupled to a gate of a transfer grounding MOS transistor 511 and the source of a first transfer MOS transistor 512. The drain of the first MOS transfer transistor 512 is electrically coupled to the second side 415 of non-speculative storage element 410. The circuit also includes a second MOS transfer transistor 513 having a source coupled to a drain of the transfer grounding 511 MOS transistor and a drain electrically coupled to the first side 414 of non-speculative storage element 410. The gates of both of the first and second transfer MOS transistors 512, 513 are electrically coupled to a transfer word line 514.

When the speculative data value stored in the speculative storage node 301 is determined to be the desired data, and therefore no longer speculative, the data value stored in the speculative storage node 301 is transferred to the non-speculative storage node 401 by activation of the transfer word line 514.

By way of example, if a "1" data value is stored in the speculative storage element 310, a high voltage will exist on the first side 315 of speculative storage element 310 and a low voltage will exist on the second side 316 of speculative storage element 310. The high voltage at node 315 will pass through the transfer inverter 510 and be reduced to a low voltage. The low voltage will not activate the transfer grounding MOS transistor 511. The low voltage will be present at the source of the first transfer MOS transistor 512. Because the transfer line 514 is electrically coupled to the gates of first transfer MOS transistor 512 and second MOS transfer transistor 513, both first and second transfer MOS transistors 512, 513 will be activated upon activation of transfer line 514. Preferably, only a single pulse, such as a half-cycle pulse, is applied to transfer line 514. With the first transfer MOS transistor 512 activated, the low voltage passes to the second side 415 of non-speculative storage element 410. The low voltage is prevented from entering the first non-speculative inverter 412 and instead passes into the second non-speculative inverter 413 because of the orientation of the first and second non-speculative inverters 412, 413 within the non-speculative storage element 410. Upon passing through the second non-speculative inverter 413, the voltage at node 414 is changed to a high voltage, and the non-speculative storage node 401 now stores a "1" data value.

As described above in relation to the speculative storage element 310 maintaining a speculative data value, the non-speculative storage element 410 retains the non-speculative data value by the nature of the cross-coupled first and second non-speculative inverters 412, 413. In this example, the second side 415 of the non-speculative storage element 410 maintains a low voltage signal. Conversely, the first side 414 of the non-speculative storage element 410 maintains a high voltage signal. The second side 415 of non-speculative storage element 410, maintaining a low voltage signal, does not activate the gate of the sixth MOS transistor 423.

The data value stored by the non-speculative storage node 401 is preferably read by first activating the read word line 418, then sensing the data values on the read bit line 419. The read bit line 419 should be pre-charged to a high voltage prior to sensing data values thereon. The voltage response of the read bit line 419 is then observed to determine the data value stored by the non-speculative storage node 401.

Activation of the read word line 418 activates the third MOS transistor 422. In the present example, the fifth MOS transistor 423 is off, e.g. open. Conversely, the voltage of the read bit line 419 remains high because no grounding path is provided by the sixth MOS transistor 423 remaining off.

Upon activation of the transfer line, as in the previous example, the first and second transfer MOS transistors 512, 513 are activated. In this example, the high voltage is present on the second side 415 of non-speculative storage element 410. The second non-speculative inverter 413 converts the high voltage to a low voltage value. Therefore, in contrast to the first example involving the preferred embodiment of the invention, the second side 415 of non-speculative storage element 410 maintains a high voltage, while the first side 414 of non-speculative storage element 410 maintains a zero or low voltage, as a grounding path is provided by second transfer MOS transistor 513 and transfer grounding transistor 522. Therefore, the sixth MOS transistor 423 is activated while the fourth MOS transistor 418 remains off. Upon reading the non-speculative storage element 410, as in the first example, the read word line 418 is activated along with the read bit line 419. In contrast to the first example, the voltage of the read bit line 419 is taken low by a grounding path afforded by the fifth transistor 423.

These examples are meant to be illustrative and not limiting. The present invention has been described by way of example, and modifications and variations of the exemplary embodiments will suggest themselves to skilled artisans in this field without departing from the spirit of the invention. Features and characteristics of the above-described embodiments may be used in combination. The preferred embodiments are merely illustrative and should not be considered restrictive in any way. The scope of the invention is to be measured by the appended claims, rather than the preceding description, and all variations and equivalents that fall within the range of the claims are intended to be embraced therein.

Having described the invention, what is claimed as new and protected by Letters Patent is:

1. A memory cell comprising:
   a non-speculative storage node for storing non-speculative data;
   a speculative storage node for storing speculative data that cannot be read from the memory cell prior to being transferred to said non-speculative storage node; and
   a circuit that transfers said speculative data from the speculative storage node into said non-speculative storage node so that the data can be read from the memory cell.

2. The memory cell as recited in claim 1 wherein said memory cell is a RAM cell.

3. The memory cell as recited in claim 1 wherein said memory cell is found in a microprocessor.

4. The memory cell as recited in claim 3 wherein said microprocessor speculatively executes instructions.

5. The memory cell as recited in claim 1 wherein said speculative storage node may flush data stored therein so as to remove said data stored therein.

6. The memory cell as recited in claim 1 wherein said speculative storage node is comprised of two cross-coupled inverters.

7. The memory cell as recited in claim 1 wherein said non-speculative storage node is comprised of two cross-coupled inverters.

8. A memory array comprising at least one memory cell, said memory array comprising:
   a non-speculative storage node for storing non-speculative data;
   a speculative storage node for storing speculative data that cannot be read from a selected memory cell prior to being transferred to said non-speculative storage node; and
   a circuit that transfers said speculative data from the speculative storage node into said non-speculative storage node so that the speculative data can be read from the selected memory cell.

9. The memory array as recited in claim 8 wherein said memory cell is a RAM cell.

10. The memory array as recited in claim 8 wherein said memory array is found in a microprocessor.

11. The memory array as recited in claim 10 wherein said microprocessor speculatively executes instructions.

12. The memory array as recited in claim 8 wherein said speculative storage node may flush data stored therein so as to remove the data stored therein.

13. The memory array as recited in claim 8 wherein said speculative storage node is comprised of two cross-coupled inverters.

14. The memory array as recited in claim 8 wherein said non-speculative storage node is comprised of two cross-coupled inverters.

15. In a memory array including at least one memory cell a method for holding data associated with a speculative execution said method comprising the steps of:
   storing non-speculative data;
   storing speculative data that cannot be read from a selected memory cell prior to being stored as non-speculative data; and
   transferring said speculative data so that the speculative data can be read as non-speculative data from the selected memory cell.

16. The method as recited in claim 15 wherein said memory cell is a RAM cell.

17. The method as recited in claim 15 wherein said memory array is found in a microprocessor.

18. The method as recited in claim 17 wherein said microprocessor speculatively executes instructions.

19. The method as recited in claim 15 wherein said speculative data is flushed so as to be removed.

20. The method as recited in claim 15 wherein said speculative data is stored in a node comprised of two cross-coupled inverters.

21. The method as recited in claim 15 wherein said non-speculative data is stored in a node comprised of two cross-coupled inverters.

22. A memory cell comprising:
   a non-speculative storage node for storing non-speculative data;
   a speculative storage node for storing speculative data that cannot be read from the memory cell prior to being transferred to said non-speculative storage node;
   a single write bit line for signaling that speculative data is to be written to the speculative storage node;
   a single transfer line for signaling that speculative data stored on the speculative storage node is to be read into the non-speculative storage node; and
   a circuit that transfers said speculative data from the speculative storage node into said non-speculative storage node so that the speculative data can be read from the memory cell.

23. The memory cell as recited in claim 22 wherein said memory cell is a RAM cell.

24. The memory cell as recited in claim 22 wherein said memory cell is found in a microprocessor.

25. The memory cell as recited in claim 24 wherein said microprocessor speculatively executes instructions.

26. The memory cell as recited in claim 22 wherein said the speculative storage node may flush data stored therein.

27. The memory cell as recited in claim 22 wherein said speculative storage node is comprised of two cross-coupled inverters.

28. The memory cell as recited in claim 22 wherein said non-speculative storage node is comprised of two cross-coupled inverters.

* * * * *